(12) United States Patent
Furukawa et al.

(10) Patent No.: US 7,919,772 B2
(45) Date of Patent: Apr. 5, 2011

(54) SEMICONDUCTOR DEVICE AND MANUFACTURING METHOD THEREOF

(75) Inventors: Shinobu Furukawa, Kanagawa (JP); Ryota Imahayashi, Kanagawa (JP)

(73) Assignee: Semiconductor Energy laboratory Co., Ltd. (JP)

( * ) Notice: Subject to any disclaimer, the term of this patent is extended or adjusted under 35 U.S.C. 154(b) by 736 days.

(21) Appl. No.: 11/791,502

(22) PCT Filed: Dec. 8, 2005

(86) PCT No.: PCT/JP2005/022989
§ 371 (c)(1),
(2), (4) Date: May 24, 2007

(87) PCT Pub. No.: WO2006/064859
PCT Pub. Date: Jun. 22, 2006

(65) Prior Publication Data
US 2008/0042128 A1    Feb. 21, 2008

(30) Foreign Application Priority Data

Dec. 14, 2004  (JP) ................. 2004-361999

(51) Int. Cl.
*H01L 29/08*  (2006.01)
(52) U.S. Cl. ....... 257/40; 257/57; 257/261; 257/E21.68; 257/E21.683; 257/E27.075; 438/82; 438/99
(58) Field of Classification Search .......... 257/40, 257/57, 59, 72, 296, 347, 314, 300, 239, 257/E21.68, E21.683, E27.075, E27.076, 257/E27.077, E27.078, E51.001–E51.052; 438/82, 99
See application file for complete search history.

(56) References Cited

U.S. PATENT DOCUMENTS

| 5,640,345 | A | 6/1997 | Okuda et al. |
| 5,888,868 | A | 3/1999 | Yamazaki et al. |
| 6,198,125 | B1 | 3/2001 | Yamazaki et al. |

(Continued)

FOREIGN PATENT DOCUMENTS

JP    5-198809    8/1993

(Continued)

OTHER PUBLICATIONS

International Search Report re application No. PCT/JP2005/022989, dated Mar. 20, 2006.

(Continued)

*Primary Examiner* — Lynne A Gurley
*Assistant Examiner* — Yosef Gebreyesus
(74) *Attorney, Agent, or Firm* — Husch Blackwell LLP

(57) ABSTRACT

A nonvolatile memory has a problem in that applied voltage is high. This is because a carrier needs to be injected into a floating gate through an insulating film by a tunneling effect. In addition, there is concern about deterioration of the insulating film by performing such carrier injection. An object of the present invention is to provide a memory in which applied voltage is lowered and deterioration of an insulating film is prevented. One feature is to use a layer in which an inorganic compound having a charge-transfer complex is mixed with an organic compound as a layer functioning as a floating gate of a memory. A specific example is an element having a transistor structure where a layer in which an inorganic compound having a charge-transfer complex is mixed with an organic compound and which is sandwiched between insulating layers is used as a floating gate.

68 Claims, 9 Drawing Sheets

U.S. PATENT DOCUMENTS

| | | |
|---|---|---|
| 6,448,135 B1 | 9/2002 | Yamazaki et al. |
| 6,486,601 B1 | 11/2002 | Sakai et al. |
| 6,556,475 B2 | 4/2003 | Yamazaki et al. |
| 6,589,673 B1 | 7/2003 | Kido et al. |
| 6,646,922 B2 | 11/2003 | Kato |
| 6,734,492 B2 | 5/2004 | Yamazaki et al. |
| 6,914,818 B2 | 7/2005 | Yamazaki et al. |
| 6,947,321 B2 | 9/2005 | Tanabe |
| 6,947,327 B2 | 9/2005 | Kato |
| 2002/0045289 A1* | 4/2002 | Dimitrakopoulos et al. ... 438/99 |
| 2003/0052336 A1* | 3/2003 | Yamazaki et al. ............ 257/200 |
| 2003/0092232 A1* | 5/2003 | Klauk et al. ................. 438/200 |
| 2003/0218166 A1* | 11/2003 | Tsutsui ........................... 257/40 |
| 2004/0002176 A1* | 1/2004 | Xu .................................. 438/40 |
| 2005/0057136 A1* | 3/2005 | Moriya et al. ................. 313/311 |
| 2005/0072989 A1* | 4/2005 | Bawendi et al. ............. 257/200 |
| 2005/0084712 A1* | 4/2005 | Kido et al. .................... 428/690 |
| 2005/0098207 A1 | 5/2005 | Matsumoto et al. |
| 2005/0151195 A1* | 7/2005 | Kawase et al. ................ 257/347 |
| 2005/0170208 A1 | 8/2005 | Yatsunami et al. |
| 2005/0248267 A1 | 11/2005 | Gyoutoku et al. |
| 2006/0237731 A1* | 10/2006 | Furukawa et al. ............... 257/83 |
| 2007/0102673 A1* | 5/2007 | Durrant et al. ................. 252/500 |
| 2007/0164272 A1* | 7/2007 | Yang et al. ...................... 257/40 |
| 2008/0048183 A1* | 2/2008 | Ohsawa et al. .................. 257/40 |

FOREIGN PATENT DOCUMENTS

| | | |
|---|---|---|
| JP | 7-153858 | 6/1995 |
| JP | 9-63771 | 3/1997 |
| JP | 11-307259 | 11/1999 |
| JP | 2004-47791 | 2/2004 |
| JP | 2004-140413 | 5/2004 |
| JP | 2005-026121 | 1/2005 |

OTHER PUBLICATIONS

Written Opinion re application No. PCT/JP2005/022989, dated Mar. 20, 2006.

* cited by examiner

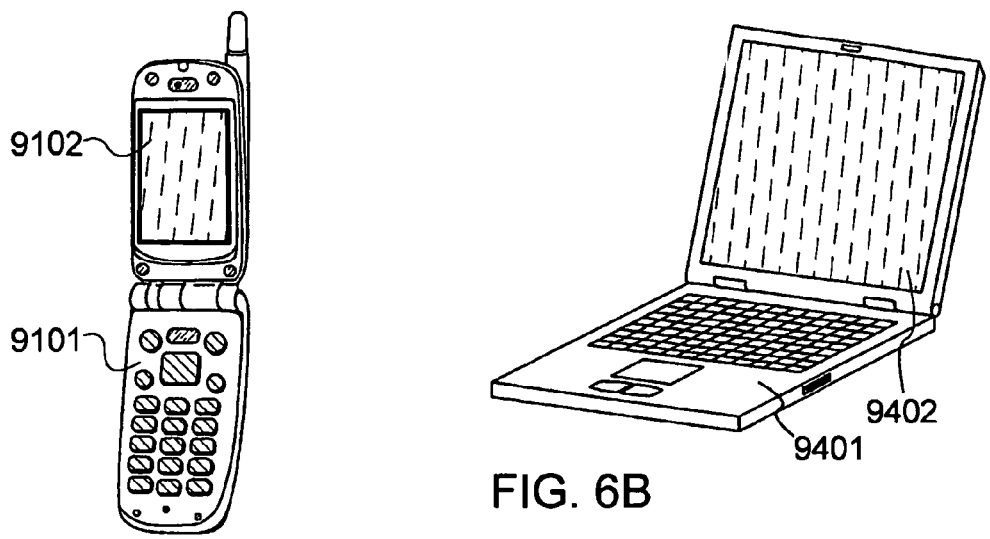
FIG. 6A
FIG. 6B
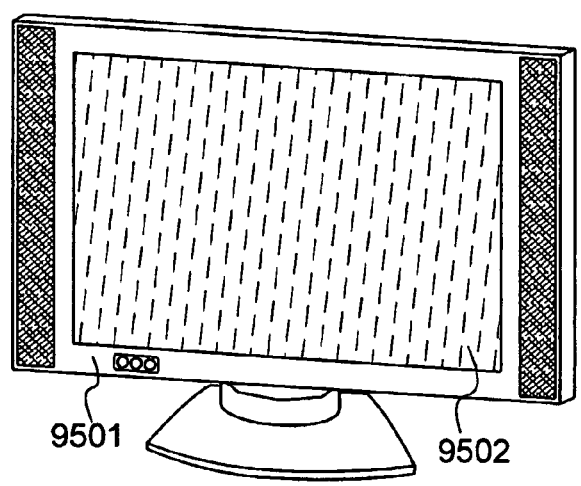
FIG. 6C
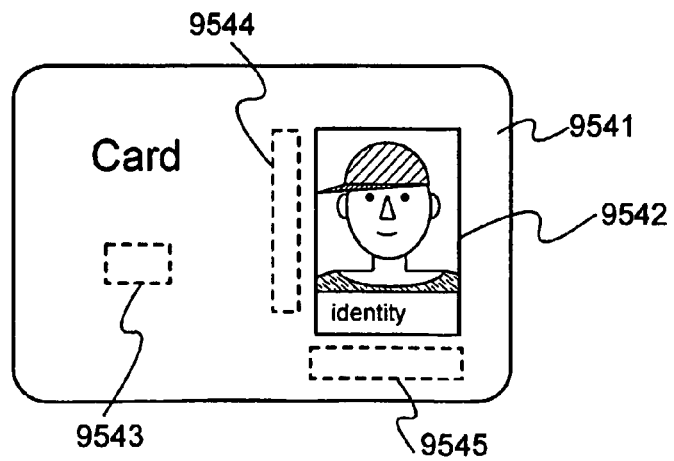
FIG. 6D

SEMICONDUCTOR DEVICE AND MANUFACTURING METHOD THEREOF

TECHNICAL FIELD

The present invention relates to a semiconductor device having a memory function and a manufacturing method thereof.

BACKGROUND ART

A nonvolatile semiconductor memory having a floating gate can retain information even when power is turned off. Thus, it is mounted on many kinds of electronic devices. In such a nonvolatile semiconductor memory, it is important to control a thickness of an insulating film which covers the floating gate. For example, there is a method for forming a nonvolatile semiconductor memory by forming a capacitor insulating film and successively forming a conductive film (Reference 1: Japanese Patent Laid-Open No. 2004-140413).

As a memory element, one having an organic semiconductor has been developed (Reference 2: Japanese Patent Laid-Open No. 2004-47791). Reference 2 discloses a switching memory element which includes an organic semiconductor memory layer exhibiting a hysteresis characteristic and a semiconductor diode layer.

DISCLOSURE OF INVENTION

However, in Reference 1, applied voltage for operating the memory is high. This is because a charge (carrier) to be stored needs to be injected into the floating gate through the insulating film by a tunneling effect. In addition, there is concern about deterioration of the insulating film by performing such carrier injection.

In Reference 2, the height of applied voltage is not considered.

It is an object of the present invention to provide a semiconductor device in which an applied voltage is reduced by a structure different from those in References 1 and 2, a memory or the like having the semiconductor device, and a manufacturing method thereof.

In view of the above object, one feature of the invention is to use a layer in which an inorganic compound having a charge-transfer complex is mixed with an organic compound (also referred to as a mixed layer) as a layer functioning as a floating gate of a memory. A specific example is a semiconductor device using, as a floating gate, a layer in which an inorganic compound having a charge-transfer complex is mixed with an organic compound, and which is sandwiched between insulating layers.

Hereinafter, a more specific structure of the invention is explained. Although metal oxide, metal nitride, or metal oxynitride can be used for the inorganic compound having a charge-transfer complex in the invention, the invention using metal oxide is described.

One feature of a semiconductor device of the invention is to include a gate electrode, a gate insulating film formed over the gate electrode, a semiconductor film formed over the gate insulating film, and a layer, in which charge separation occurs when voltage is applied to the gate electrode, between the gate electrode and the semiconductor layer.

Another feature of a semiconductor device of the present invention is to include a gate electrode, a first insulating layer formed as a gate insulating film over the gate electrode, a semiconductor film formed over the first insulating layer, and a layer in which metal oxide is mixed with an organic compound and a second insulating layer which are sequentially laminated over the first insulating layer, wherein the metal oxide is any one of vanadium oxide, molybdenum oxide, niobium oxide, rhenium oxide, tungsten oxide, ruthenium oxide, titanium oxide, chromium oxide, zirconium oxide, hafnium oxide, and tantalum oxide.

Another feature of a semiconductor device of the present invention is to include a gate electrode, a first insulating layer formed as a gate insulating film over the gate electrode, a semiconductor film formed over the first insulating layer, and a first organic compound layer, a layer in which metal oxide is mixed with a second organic compound, and a second insulating layer which are sequentially laminated over the first insulating layer, wherein the metal oxide is any one of vanadium oxide, molybdenum oxide, niobium oxide, rhenium oxide, tungsten oxide, ruthenium oxide, titanium oxide, chromium oxide, zirconium oxide, hafnium oxide, and tantalum oxide.

In the invention, the semiconductor film may be either an organic semiconductor film or an inorganic semiconductor film.

The present invention provides a method for manufacturing a semiconductor device, one feature of which is to include the steps of forming a gate electrode, forming a gate insulating film formed over the gate electrode, forming a semiconductor film over the gate insulating film, and forming a layer, in which charge separation occurs when voltage is applied to the gate electrode, between the gate electrode and the semiconductor film.

The layer in which charge separation occurs is a layer having a charge-transfer complex, and the charge-transfer complex means one functioning as an electron accepting material. As a specific example thereof, oxide of any one of transition metals belonging to Groups 4 to 12 of the periodic table can be used. Among them, many of oxides of transition metals belonging to Groups 4 to 8 of the periodic table have higher electron accepting properties. In particular, vanadium oxide, molybdenum oxide, niobium oxide, rhenium oxide, tungsten oxide, ruthenium oxide, titanium oxide, chromium oxide, zirconium oxide, hafnium oxide, or tantalum oxide is preferable.

Note that the layer in which an inorganic compound having a charge-transfer complex is mixed with an organic compound is preferably formed by a co-evaporation method. Accordingly, the layer in which an inorganic compound having a charge-transfer complex is mixed with an organic compound can be a mixed layer of them or a laminated layer thereof.

Note that the semiconductor device includes a thin film transistor or an electronic device using the thin film transistor. In addition, a semiconductor device using an organic semiconductor is referred to as an organic semiconductor device, and the organic semiconductor device includes an organic thin film transistor or an electronic device using the organic thin film transistor.

According to the invention, charge separation easily occurs in the layer in which an inorganic compound having a charge-transfer complex is mixed with an organic compound. Then, the mixed layer, an insulator, and a conductor can constitute a capacitor, and hysteresis due to a charge to be stored in the capacitor occurs. A new memory element, to which this characteristic is applied, can be formed.

In addition, applied voltage can be reduced by employing, as a floating gate, such a layer in which charge separation easily occurs. Consequently, when the organic semiconductor device of the invention is utilized as a memory or the like, power consumption of an electronic device mounted with the memory can be reduced.

Further, since a carrier is not injected into an insulating film in the invention, deterioration of the insulating film can be prevented.

BRIEF DESCRIPTION OF DRAWINGS

FIGS. 6A to 6D show electronic devices using an organic semiconductor device of the present invention.

BEST MODE FOR CARRYING OUT THE INVENTION

Figure 1A:
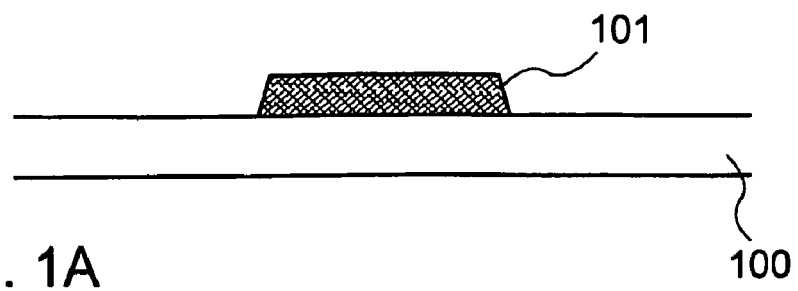
FIGS. 1A to 1D are cross-sectional views showing a manufacturing process of an organic semiconductor device of the present invention.

Hereinafter, embodiment modes of the invention are explained with reference to the drawings. However, the present invention can be carried out in many different modes. As is easily known to a person skilled in the art, the mode and the detail of the invention can be variously changed without departing from the spirit and the scope of the invention. Thus, the present invention is not interpreted while limiting to the following description of the embodiment modes. Note that the same reference numeral is used to denote the same portion or a portion having a similar function among drawings for explaining the embodiment modes, and repetitive description is omitted.

Embodiment Mode 1

In this embodiment mode, explained is a method for manufacturing an organic semiconductor device, specifically an organic thin film transistor, having a layer in which an inorganic compound having a charge-transfer complex is mixed with an organic compound.

As shown in FIG. 1A, a substrate 100 having an insulating surface is prepared. For example, a glass substrate of barium borosilicate glass, alumino borosilicate glass, or the like, a quartz substrate, a stainless-steel (SUS) substrate, or the like can be used as the substrate 100. In addition, a substrate formed of a flexible synthetic resin such as plastic typified by PET (polyethylene terephthalate), PEN (polyethylenenaphthalate), or PES (polyethersulfone) or acrylic can be used since high-temperature treatment is not required in a manufacturing process of the organic semiconductor device of the invention.

A base film may be formed over the substrate 100. The base film is formed to prevent alkali metal or alkaline earth metal, such as Na, contained in the substrate 100 from diffusing and adversely affecting properties of a semiconductor element. For example, an insulating film of silicon oxide, silicon nitride, silicon nitride oxide, or the like can be used as the base film.

A step of forming a gate electrode 101 over the substrate 100 is explained. First, a conductive film to serve as the gate electrode 101 is formed. The conductive film may have a single-layer structure or a laminated structure. In the case of a laminated structure, for example, each of a first conductive film and a second conductive film may be formed from an element of Ta, W, Ti, Mo, Al, Cu, Cr, Mo, Ni, Au, Pd, Pt, Ag, or Si, an alloy or compound material containing the element as its main component, a compound such as indium oxide, tin oxide, ITO (indium tin oxide), or the like. Such a conductive film can be formed by a sputtering method, a CVD method, a droplet discharge method (typically, an ink-jet method), or the like.

Subsequently, the conductive film is applied with a photoresist (hereinafter also referred to as a resist mask) by a spin coating method or the like. The resist mask can be either a positive type or a negative type. At this time, a resist mask to which a light absorbing agent is added may be used. A mask having higher hardness than a resist mask formed of an organic material, for example, a mask formed of an inorganic compound such as a silicon oxide film may be used.

Then, the conductive film is etched using the resist mask to form the gate electrode 101. As for the etching, dry etching using a gas of $CF_4$, Cl, $O_2$, or the like or wet etching using a liquid of HF or the like can be used. At this time, etching conditions may be determined so that an edge portion of the gate electrode 101 has a tapered shape. When the gate electrode 101 has a tapered shape, step coverage of a film to be formed later can be improved. Note that a scanning line for inputting a signal to the gate electrode 101 can be formed simultaneously.

Note that the present invention is not limited to the above-described method for manufacturing the gate electrode. For example, the gate electrode may be formed by a droplet discharge method (typically, an ink-jet method) which does not require the etching step. When the gate electrode 101 is formed using a droplet discharge method, the use of the resist mask can be eliminated.

Figure 1B:
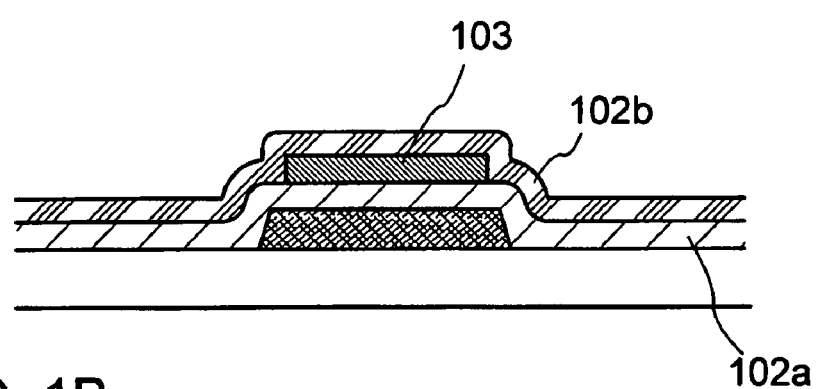

Thereafter, a first insulating layer 102a is formed to cover the gate electrode 101 as shown in FIG. 1B. The first insulating layer 102a has a function as a gate insulating film.

As the first insulating layer 102a, a layer of an inorganic compound such as silicon oxide, silicon nitride, or silicon oxynitride can be used. Alternatively, an organic compound layer such as polyimide, polyparaxylylene, polyacrylonitrile, polyxylene, polystyrene, polyvinyl phenol, or polyvinyl alcohol can be used as the first insulating layer 102a. Note that, in order to reduce applied voltage, a high dielectric constant material such as $HfSiO_x$ may be used for the first insulating layer 102a. The first insulating layer can be formed by a plasma CVD method, an LPCVD method, a thermal CVD method, a vacuum evaporation method, a sputtering method, a spin coating method, a droplet discharge method (typically, an ink-jet method), or a thermal oxidation method.

Subsequently, a layer 103 in which an inorganic compound having a charge-transfer complex is mixed with an organic compound is formed. In this embodiment mode, the layer 103 in which an inorganic compound having a charge-transfer complex is mixed with an organic compound is employed as a floating gate. Therefore, the layer 103 in which an inorganic compound having a charge-transfer complex is mixed with an organic compound is processed (hereinafter referred to as being patterned) so that a portion thereof overlaps the gate electrode 101.

As the inorganic compound having a charge-transfer complex, a material functioning as an electron accepting material is used. As a specific example thereof, oxide of any one of transition metals belonging to Groups 4 to 12 of the periodic table can be used. Among them, many of oxides of transition metals belonging to Groups 4 to 8 of the periodic table have better electron accepting properties. In particular, vanadium oxide, molybdenum oxide, niobium oxide, rhenium oxide, tungsten oxide, ruthenium oxide, titanium oxide, chromium oxide, zirconium oxide, hafnium oxide, or tantalum oxide is preferable.

As the organic compound, a hole transporting material may be used. The hole transporting material is a material having higher transportability of holes than that of electrons. An organic compound, for example, an aromatic amine compound such as 4,4'-bis[N-(1-naphthyl)-N-phenylamino]biphenyl (abbr.: α-NPD), 4,4'-bis[N-(3-methylphenyl)-N-phenylamino]biphenyl (abbr.: TPD), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), or 4,4'-bis{N-[4-(N,N-di-m-tolylamino)phenyl]-N-phenylamino}biphenyl (abbr.: DNTPD), a phthalocyanine compound such as phthalocyanine (abbr.: $H_2Pc$), copper phthalocyanine (abbr.: CuPc), or vanadyl phthalocyanine (abbr.: VOPc), or the like can be used. In this embodiment mode, the above-described triphenylamine compound is preferable; for example, a phthalocyanine compound may be used.

Such a layer may be any layer as long as charge separation easily occurs in it when voltage is applied. Therefore, the layer is not limited to a combination of the above materials as long as it has a similar function. For example, it may be a combination of organic compounds, and tetrafluorotetracyanoquinodimethane (abbr.: F4-TCNQ) or the like can be used.

By using such a layer in which an inorganic compound having a charge-transfer complex is mixed with an organic compound, crystallization of the organic compound can be suppressed, and the layer can be thickly formed without an increase in resistance. In addition, conductivity of the layer in which an inorganic compound is mixed with an organic compound is increased. Therefore, applied voltage does not become high even when the layer is thickened, which is preferable.

The layer 103 in which an inorganic compound having a charge-transfer complex is mixed with an organic compound can be formed by an evaporation method, preferably, by a co-evaporation method using the materials. The co-evaporation method includes a co-evaporation method using resistance heating evaporation, a co-evaporation method using electron beam evaporation, and a co-evaporation method using resistance heating evaporation and electron beam evaporation. Further, the layer 103 can be formed by combining the same kind of methods or different kinds of methods, for example, a formation method using resistance heating evaporation and sputtering, a formation method using electron beam evaporation and sputtering, and the like. In addition, the above described examples are given in consideration of forming a layer containing two kinds of materials; however, a layer containing three or more kinds of materials can also be formed by combining the same kind of methods or different kinds of methods.

Then, a second insulating layer 102b is formed. Since the second insulating layer 102b is formed over the layer 103 in which an inorganic compound having a charge-transfer complex is mixed with an organic compound, the second insulating layer 102b is formed so as not to damage the layer 103. For example, the layer 103 in which an inorganic compound having a charge-transfer complex is mixed with an organic compound may be formed to be sufficiently thick. In the invention, by using the layer in which an inorganic compound having a charge-transfer complex is mixed with an organic compound, crystallization of the organic compound can be suppressed, and the layer can be thickly formed without an increase in resistance. Further, applied voltage does not become high even when the layer is thickened, which is preferable.

If the damage to the layer 103 is controlled to be within the allowable range, the second insulating layer 102b can be formed of a similar material or by a similar method to those of the first insulating layer 102a. When the second insulating layer 102b is formed using a thermal CVD method, damage to the layer 103 in which an inorganic compound having a charge-transfer complex is mixed with an organic compound can be reduced, which is preferable. At this time, the second insulating layer 102b may be formed using a xylylene dimer or a derivative thereof.

When the layer 103 in which an inorganic compound having a charge-transfer complex is mixed with an organic compound is sandwiched between the first insulating layer 102a and the second insulating layer 102b, charge separation occurs in the layer 103 in which an inorganic compound having a charge-transfer complex is mixed with an organic compound when gate voltage is applied. Then, the mixed layer 103, the first insulating layer 102a, the second insulating layer 102b, the gate electrode 101, and a semiconductor film 105 to be formed later can constitute a capacitor, and hysteresis due to a charge to be stored in the capacitor occurs. A new memory element can be provided utilizing this characteristic.

In addition, applied voltage can be reduced by employing, as a floating gate, a layer in which charge separation easily occurs, specifically, the layer 103 in which an inorganic compound having a charge-transfer complex is mixed with an organic compound. Consequently, when the organic semiconductor device of the invention is utilized as a memory or the like, power consumption of an electronic device mounted with the memory can be reduced.

Further, since a carrier is not injected into the first insulating layer 102a and the second insulating layer 102b in the organic semiconductor device of this embodiment mode, deterioration of these insulating layers can be prevented.

As described above, one feature of the invention is to provide the layer in which an inorganic compound having a charge-transfer complex is mixed with an organic compound between the first insulating layer 102a and the second insulating layer 102b. Therefore, an additional organic compound or the like may further be formed between the first insulating layer 102a and the second insulating layer 102b.

Figure 3A:
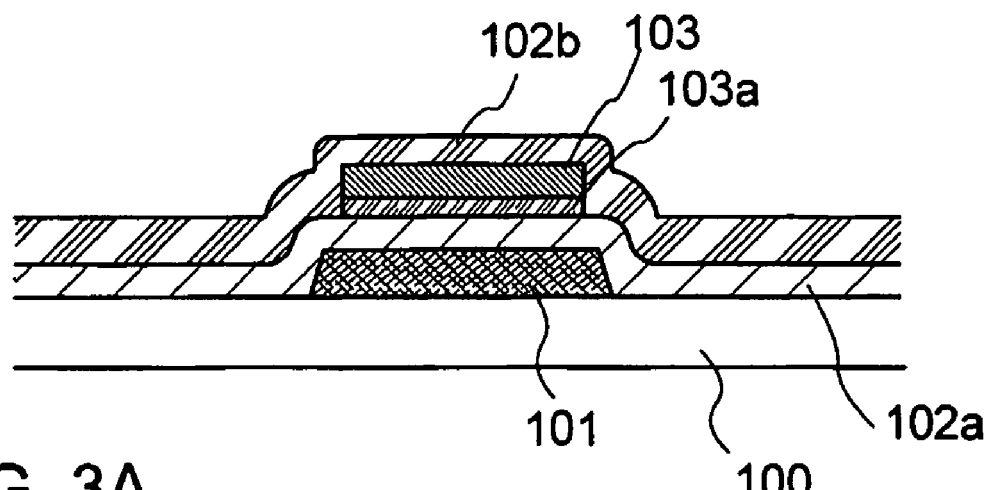
FIGS. 3A and 3B are cross-sectional views of an insulating film of the present invention.

For example, in the case of providing a p-type organic semiconductor layer, an organic compound 103a can further be formed, as shown in FIG. 3A, between the first insulating layer 102a and the layer 103 in which an inorganic compound having a charge-transfer complex is mixed with an organic compound. In the case of forming such a laminated structure, the layer 103 in which an inorganic compound having a charge-transfer complex is mixed with an organic compound and the organic compound 103a may be simultaneously patterned.

As a material of the organic compound 103a, a hole transporting material may be used. The hole transporting material is a material having higher transportability of holes than that of electrons. It can be selected from an aromatic amine compound such as 4,4'-bis[N-(1-naphthyl)-N-phenylamino]biphenyl (abbr.: α-NPD), 4,4'-bis[N-(3-methylphenyl)-N-phenylamino]biphenyl (abbr.: TPD), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), or 4,4'-bis{N-[4-(N,N-di-m-tolylamino)phenyl]-N-phenylamino}biphenyl (abbr.: DNTPD), a phthalocyanine compound such as phthalocyanine (abbr.: $H_2Pc$), copper phthalocyanine (abbr.: CuPc), or vanadyl phthalocyanine (abbr.: VOPc), or the like. For example, TPD can be used.

By providing the organic compound 103a having the hole transporting material between the first insulating layer 102a and the layer 103 in which an inorganic compound having a charge-transfer complex is mixed with an organic compound, an electron and a hole can be immediately divided and separated from each other after charge separation occurs. Accordingly, an electron and a hole can be prevented from bonding to each other.

Further, the organic compound 103a having a hole transporting material may be formed to have a laminated structure of the above materials. At this time, by sequentially laminating organic compounds having lower and lower ionization potentials as the distance from the layer 103 in which an inorganic compound having a charge-transfer complex is mixed with an organic compound increases, a hole can be held even if applied voltage is turned off. As a result, when applied voltage is turned off, a hole and an electron can be prevented from bonding to each other in the layer 103 in which an inorganic compound having a charge-transfer complex is mixed with an organic compound and information can be held.

Figure 3B:
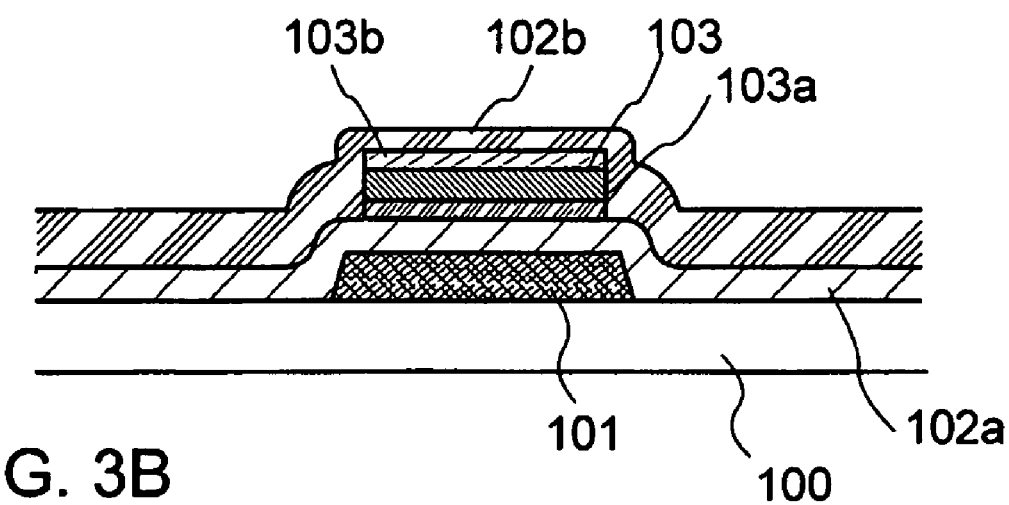

In the case of providing a p-type organic semiconductor film, an organic compound 103b can further be formed, as shown in FIG. 3B, between the layer 103 in which an inorganic compound is mixed with an organic compound and the second insulating layer 102b. In the case of forming such a laminated structure, the layer 103 in which an inorganic compound having a charge-transfer complex is mixed with an organic compound, the organic compound 103a, and the organic compound 103b may be simultaneously patterned.

As a material of the organic compound 103b, an electron transporting material may be used. The electron transporting material is a material having higher transportability of electrons than that of holes. For example, a metal complex such as tris(8-quinolinolato)aluminum (abbr.: $Alq_3$), tris(4-methyl-8-quinolinolato)aluminum (abbr.: $Almq_3$), bis(10-hydroxybenzo[h]-quinolinato)beryllium (abbr.: $BeBq_2$), bis(2-methyl-8-quinolinolato)-4-phenylphenolato-aluminum (abbr.: BAlq), bis[2-(2-hydroxyphenyl)benzoxazolato]zinc (abbr.: $Zn(BOX)_2$), or bis[2-(2-hydroxyphenyl)benzothiazolato]zinc (abbr.: $Zn(BTZ)_2$) can be used. In addition, the following material can also be used as the electron transporting material: 2-(4-biphenylyl)-5-(4-tert-butylphenyl)-1,3,4-oxadiazole (abbr.: PBD), 1,3-bis[5-(p-tert-butylphenyl)-1,3,4-oxadiazole-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), 4,4'-bis(5-methyl-benzoxazol-2-yl)stilbene (abbr.: BzOS), or the like. Alternatively, an n-type semiconductor or a layer to which alkali metal is added can be used as the organic compound 103b.

By providing the organic compound having the electron transporting material between the layer 103 in which an inorganic compound having a charge-transfer complex is mixed with an organic compound and the second insulating layer 102b, an electron and a hole can be immediately divided and separated from each other after charge separation occurs. Accordingly, an electron and a hole can be prevented from bonding to each other.

Further, the organic compound 103b having an electron transporting material may be formed to have a laminated structure of the above materials. At this time, by sequentially laminating organic compounds having higher and higher electron affinities as the distance from the layer 103 in which an inorganic compound having a charge-transfer complex is mixed with an organic compound increases, a separated state of an electron can be maintained even if applied voltage is turned off. As a result, when applied voltage is turned off, a hole and an electron can be prevented from bonding to each other in the layer 103 in which an inorganic compound having a charge-transfer complex is mixed with an organic compound and information can be held. This can be utilized for a memory.

Note that the case of providing a p-type organic semiconductor film is explained with reference to FIGS. 3A and 3B. In the case of providing an n-type organic semiconductor film, the organic compound 103a having a hole transporting material is formed between the layer 103 in which an inorganic compound is mixed with an organic compound and the second insulating layer 102b. In addition, in the case of further providing the organic compound 103b having an electron transporting material, the organic compound 103b is formed between the first insulating layer 102a and the layer 103 in which an inorganic compound is mixed with an organic compound. This is due to a difference in polarity of applied voltage for driving.

Figure 1C:
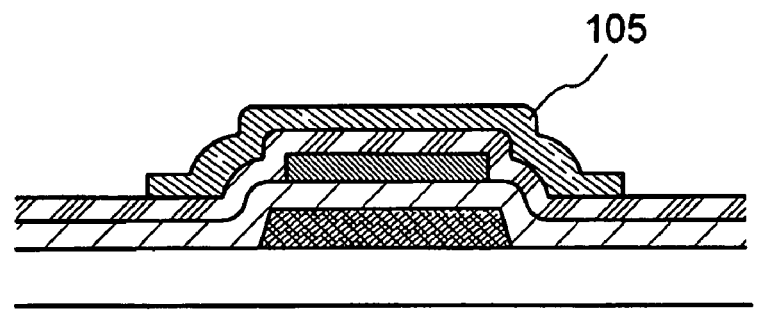

Subsequently, the semiconductor film 105 is formed as shown in FIG. 1C. The semiconductor film is an organic semiconductor film using an organic molecular crystal or an organic high molecular weight compound. As a specific example of the organic molecular crystal, a polycyclic aromatic compound, a conjugated double bond compound, phthalocyanine, a charge-transfer complex, or the like can be given. For example, anthracene, tetracene, pentacene, hexathiophene (6T), tetracyanoquinodimethane (TCNQ), perylenetetracarboxylic dianhydride (PTCDA), naphthalenetetracarboxylic dianhydride (NTCDA), or the like can be used. As a specific example of the organic high molecular weight compound, a π-conjugated high molecular weight material, a carbon nanotube, polyvinyl pyridine, a phthalocyanine metal complex, or the like can be given. In particular, polyacetylene, polyaniline, polypyrrole, polyethylene, a polythiophene derivative, poly(3 alkylthiophene), a polyparaphenylene derivative, or a polyparaphenylene vinylene derivative can be employed, which is a π-conjugated high molecular weight material whose skeleton is formed with conjugated double bonds. These organic semiconductor materials include one exhibiting polarity of n-type or p-type.

Such an organic semiconductor film can be formed by a vacuum evaporation method, a spin coating method, a spray method, a droplet discharge method (typically, an ink-jet method), a screen method, a cast method, or a pulling method.

Since such an organic semiconductor film does not require high-temperature treatment such as crystallization, it can be formed over a plastic substrate. Accordingly, cost reduction of an organic semiconductor device can be attempted. In addition, the organic semiconductor film can be formed over a flexible substrate; thus, a flexible organic semiconductor device can be provided.

Figure 1D:
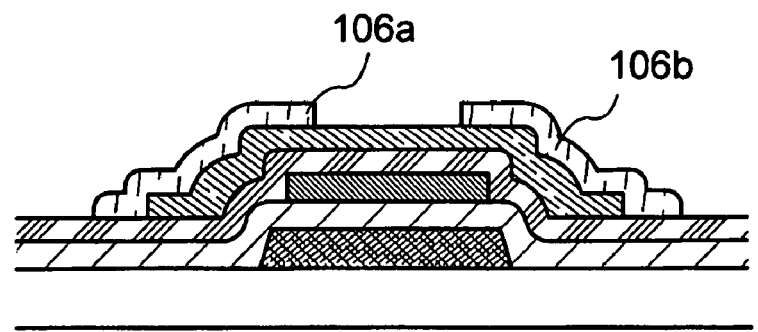

Thereafter, a source electrode 106a and a drain electrode 106b are formed as shown in FIG. 1D. These electrodes can be formed using a similar material or manufacturing method to that of the gate electrode 101.

As described above, a so-called top contact type organic semiconductor device, in which a source electrode and a drain electrode are formed as an upper layer, can be completed.

Embodiment Mode 2

In this embodiment mode, explained is a structure of a so-called bottom contact type organic semiconductor device, which is different from the above embodiment mode.

Figure 2A:
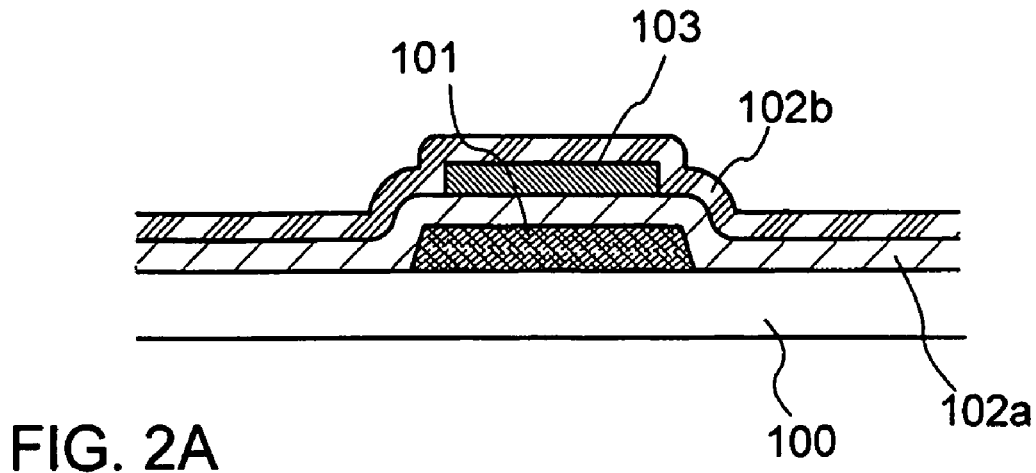
FIGS. 2A to 2C are cross-sectional views showing a manufacturing process of an organic semiconductor device of the present invention.

As shown in FIG. 2A, a gate electrode 101 and a first insulating layer 102a which functions as a gate insulating film are formed over a substrate 100 similarly as in FIGS. 1A and 1B. A material, a manufacturing method, or the like of the substrate, the gate electrode, or the first insulating layer can be selected similarly as in the above embodiment mode.

Subsequently, a layer 103 in which an inorganic compound having a charge-transfer complex is mixed with an organic compound is formed. In this embodiment mode, the layer 103 in which an inorganic compound having a charge-transfer complex is mixed with an organic compound is employed as a floating gate. Therefore, the layer 103 in which an inorganic compound having a charge-transfer complex is mixed with an organic compound is patterned so that a portion thereof overlaps the gate electrode 101. A material, a manufacturing method, or the like of the layer 103 in which an inorganic compound having a charge-transfer complex is mixed with an organic compound can be selected similarly as in the above embodiment mode.

Then, a second insulating layer 102b is formed. A material, a manufacturing method, or the like of the second insulating layer 102b can be selected similarly as in the above embodiment mode.

As to such a lamination body including the first insulating layer 102a, the second insulating layer 102b, and the layer 103 in which an inorganic compound having a charge-transfer complex is mixed with an organic compound, charge separation occurs, when gate voltage is applied, in the layer 103 in which an inorganic compound having a charge-transfer complex is mixed with an organic compound. Then, the mixed layer 103, the first insulating layer 102a, the second insulating layer 102b, the gate electrode 101, and a semiconductor film 105 to be formed later can constitute a capacitor, and hysteresis due to a charge to be stored in the capacitor occurs. A new memory element utilizing this characteristic can be provided.

In addition, applied voltage can be reduced by employing, as a floating gate, a layer in which charge separation easily occurs, specifically, the layer 103 in which an inorganic compound having a charge-transfer complex is mixed with an organic compound. Consequently, the organic semiconductor device of the invention can be utilized as a memory or the like, and power consumption of an electronic device provided with the memory can be reduced.

Further, since a carrier is not injected into the first insulating layer 102a and the second insulating layer 102b in the organic semiconductor device of this embodiment mode, deterioration of these insulating layers can be prevented.

In addition, a so-called bottom contact type organic semiconductor device, in which a semiconductor layer is formed as an upper layer of a source electrode and a drain electrode, can also employ a laminated structure provided with organic compounds 103a and 103b having a hole transporting material and an electron transporting material as shown in FIGS. 3A and 3B and can exert its effect.

Note that the case of providing a p-type organic semiconductor film is explained with reference to FIGS. 3A and 3B. In the case of providing an n-type organic semiconductor film, an organic compound 103a having a hole transporting material is formed between the layer 103 in which an inorganic compound having a charge-transfer complex is mixed with an organic compound and the second insulating layer 102b as described in the above embodiment mode. In addition, in the case of further providing an organic compound 103b having an electron transporting material, the organic compound 103b is formed between the first insulating layer 102a and the layer 103 in which an inorganic compound having a charge-transfer complex is mixed with an organic compound. This is due to a difference in polarity of applied voltage for driving.

Figure 2B:
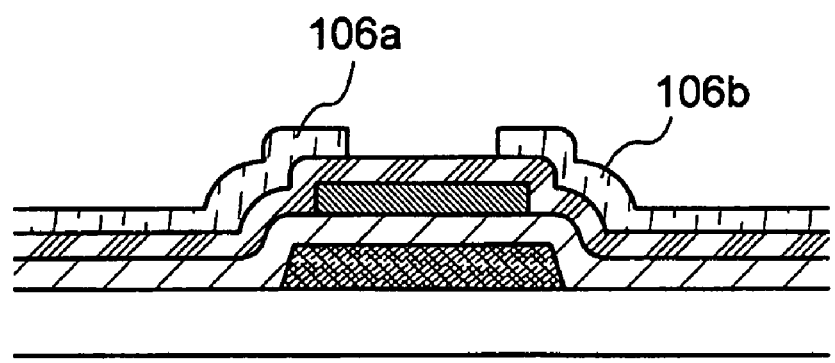
Figure 2C:
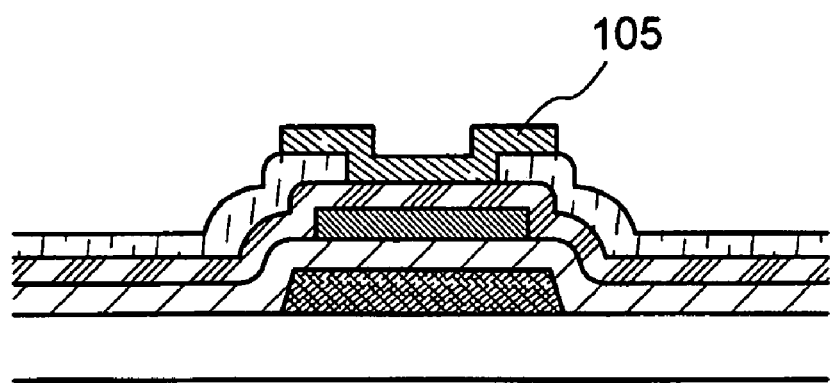

Subsequently, similarly as in FIG. 1D, a source electrode 106a and a drain electrode 106b are formed as shown in FIG. 2B. Thereafter, similarly as in FIG. 1C, the semiconductor film 105 is formed as shown in FIG. 2C. A material, a manufacturing method, or the like of the source electrode 106a, the drain electrode 106b, or the semiconductor film 105 can be selected similarly as in the above embodiment mode.

As described above, a bottom contact type organic semiconductor device can be completed. The bottom contact type organic semiconductor device of the invention can also employ the structure of the lamination body of the invention and can exert its effect.

Embodiment Mode 3

A structure of the invention, in which a layer where charge separation occurs is formed between insulating films and employed as a floating gate, can be employed in a semiconductor device including, as a semiconductor film, a film containing silicon that is an inorganic material. Thus, in this embodiment mode, explained is a semiconductor device, specifically a thin film transistor, in which a semiconductor film contains silicon, and which is different from the above embodiment mode.

Figure 4:
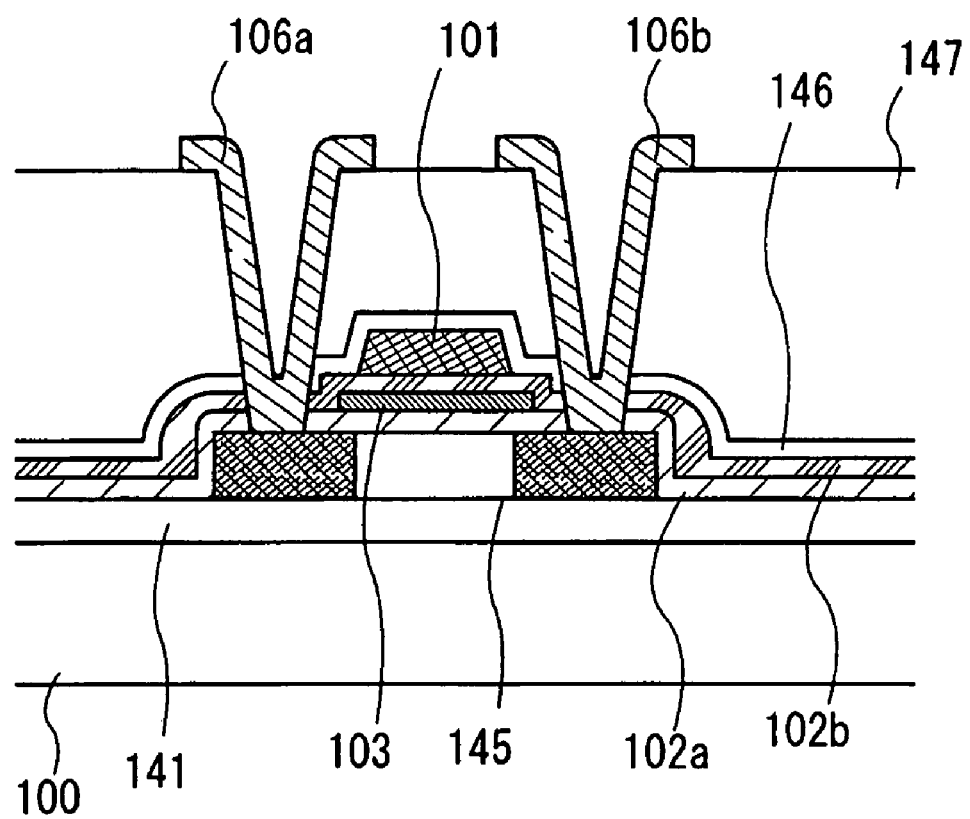
FIG. 4 is a cross-sectional view of a semiconductor device of the present invention.

As shown in FIG. 4, a silicon-containing semiconductor film 145 is formed over a substrate 100 with a base film 141 there between. As for the base film 141, an insulating film of silicon oxide, silicon nitride, silicon nitride oxide, or the like can be used as described in the above embodiment mode. In a semiconductor device described in this embodiment mode, the semiconductor film 145 is formed near the substrate 100. Thus, the base film 141 is preferably provided actively.

Subsequently, a first insulating layer 102a which functions as a gate insulating film, a layer 103 in which an inorganic compound having a charge-transfer complex is mixed with an organic compound, and a second insulating layer 102b are formed so as to cover the semiconductor film 145. A material or a manufacturing method of the first insulating layer 102a, the layer 103 in which an inorganic compound having a charge-transfer complex is mixed with an organic compound, or the second insulating layer 102b can be selected similarly as in the above embodiment mode. Then, a structure in which the first insulating layer 102a, the layer 103 in which an inorganic compound having a charge-transfer complex is mixed with an organic compound, and the second insulating layer 102b are sequentially laminated is formed. The layer 103 in which an inorganic compound having a charge-transfer complex is mixed with an organic compound can function as a floating gate.

As to such a lamination body including the first insulating layer 102a, the second insulating layer 102b, and the layer 103 in which an inorganic compound having a charge-transfer complex is mixed with an organic compound, charge separation occurs, when gate voltage is applied, in the layer 103 in which an inorganic compound having a charge-transfer complex is mixed with an organic compound. Then, the mixed layer 103, the first insulating layer 102a, the second insulating layer 102b, a gate electrode 101, and the semiconductor film 145 can constitute a capacitor, and hysteresis due to a charge to be stored in the capacitor occurs. A new memory element utilizing this characteristic can be provided.

In addition, applied voltage can be reduced by employing, as a floating gate, the layer 103 in which an inorganic compound having a charge-transfer complex is mixed with an organic compound and in which charge separation easily occurs. Consequently, when the organic semiconductor device of the invention is utilized as a memory or the like, power consumption of an electronic device mounted with the memory can be reduced.

Further, since a carrier is not injected into the first insulating layer 102a and the second insulating layer 102b in the organic semiconductor device of this embodiment mode, deterioration of these insulating layers can be prevented.

In addition, the semiconductor device using a silicon-containing semiconductor film can also employ a laminated structure provided with organic compounds 103a and 103b having a hole transporting material and an electron transporting material as shown in FIGS. 3A and 3B and can exert its effect.

Note that the case of providing a p-type organic semiconductor film is explained with reference to FIGS. 3A and 3B. In this embodiment mode, a p-type thin film transistor in which an impurity region is doped with phosphorus or the like can employ a structure where a layer having a hole transporting material is provided between the first insulating layer 102a and the layer 103 in which an inorganic compound having a charge-transfer complex is mixed with an organic compound as shown in FIG. 3A. Further, as shown in FIG. 3B, the p-type thin film transistor can employ a structure where a layer having an electron transporting material is provided between the layer 103 in which an inorganic compound having a charge-transfer complex is mixed with an organic compound and the second insulating layer 102b.

On the other hand, in an n-type thin film transistor in which an impurity region is doped with boron or the like, the order of lamination is different from those shown in FIGS. 3A and 3B. The organic compound 103a having a hole transporting material is provided between the layer 103 in which an inorganic compound having a charge-transfer complex is mixed with an organic compound and the second insulating layer 102b. In the case of further providing the organic compound 103b having an electron transporting material, the organic compound 103b is provided between the first insulating layer 102a and the layer 103 in which an inorganic compound having a charge-transfer complex is mixed with an organic compound. This is due to a difference in polarity of applied voltage for driving.

Figure 8A:
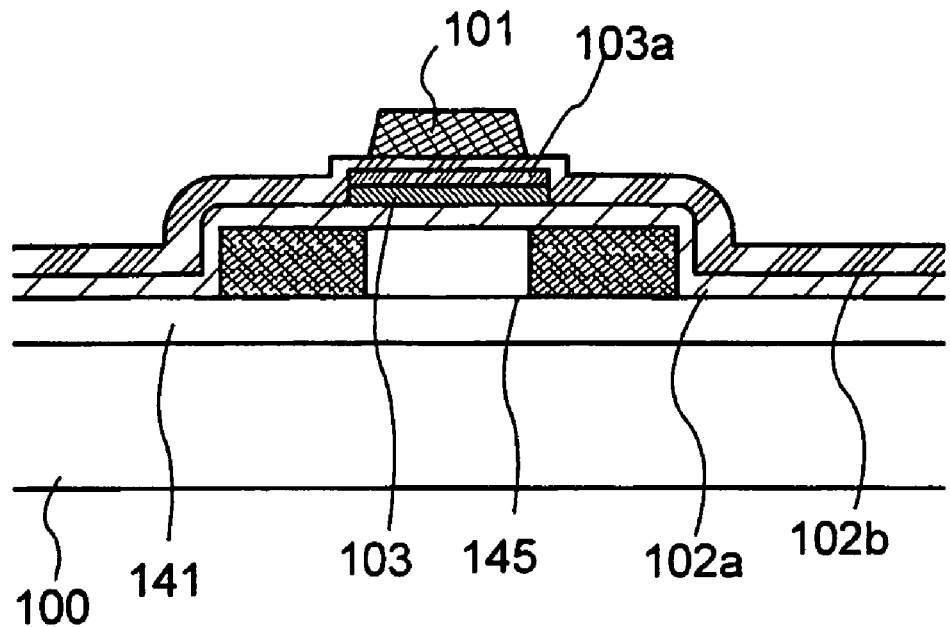
FIGS. 8A and 8B are cross-sectional views of an insulating film of the present invention.

As an example thereof, in the case of providing the organic compound 103a having a hole transporting material, the organic compound 103a having a hole transporting material is provided between the layer 103 in which an inorganic compound having a charge-transfer complex is mixed with an organic compound and the second insulating layer 102b as shown in FIG. 8A.

Figure 8B:
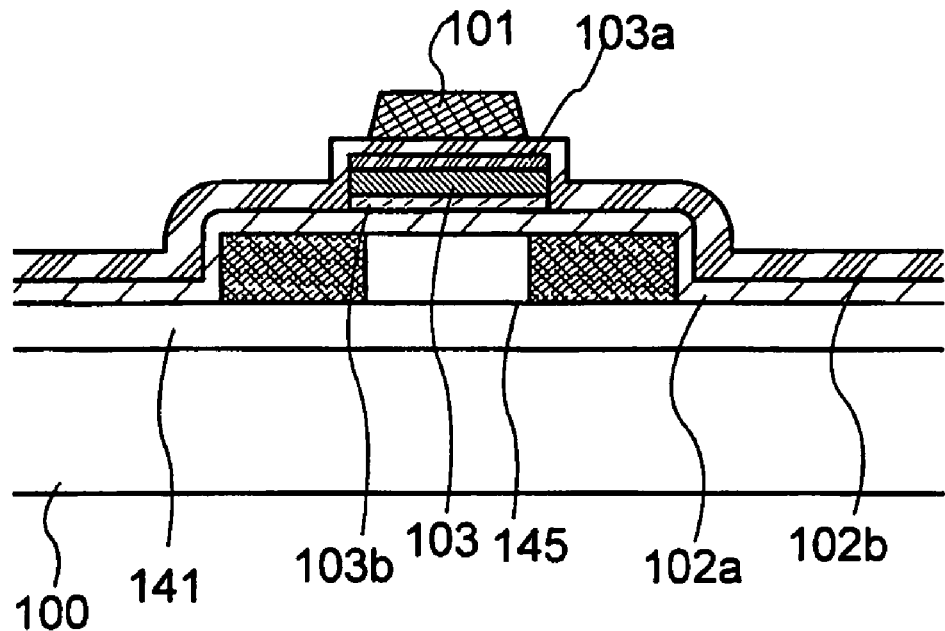

Further, in the case of providing the organic compound 103b having an electron transporting material, the organic compound 103b having an electron transporting material is provided, as shown in FIG. 8B, between the first insulating layer 102a and the layer 103 in which an inorganic compound is mixed with an organic compound.

Thereafter, the gate electrode 101 is formed as shown in FIG. 4. A material or a manufacturing method of the gate electrode can be similar to that in the above embodiment mode. The semiconductor film 145 can be doped with an impurity element using the gate electrode 101 to form an impurity region. As the impurity region, a high concentration impurity region and a low concentration impurity region can be separately formed by controlling an addition amount. A structure having the low concentration impurity region is a so-called LDD (Lightly Doped Drain) structure. Further, a so-called GOLD (Gate Overlapped LDD) structure can be formed by providing an impurity region to be overlapped with the gate electrode 101.

Subsequently, an insulating film 146 is formed to cover the gate electrode 101. The insulating film 146 can be formed using a silicon-containing insulating film of silicon oxide, silicon nitride, or the like by, for example, a CVD method. If heat treatment is performed in this state, a dangling bond in the semiconductor film 145 can be terminated since the insulating film 146 formed by a CVD method contains a large amount of hydrogen, which is preferable.

Subsequently, an insulating film 147 is formed to improve planarity. The insulating film 147 can be formed by a SOG method, a droplet discharge method, a sputtering method, or a plasma CVD method. The insulating film 147 may have either a single-layer structure or a laminated structure. As a material of the insulating film 147, an inorganic material or an organic material can be used. When the insulating film 147 has a laminated structure, an inorganic material and an organic material may be sequentially laminated from the bottom. When an organic material is used, planarity can be improved. As such an organic material, polyimide, acrylic, polyamide, polyimide amide, a resist, benzocyclobutene, siloxane, or polysilazane can be used. Siloxane has a skeleton formed by the bond of silicon (Si) and oxygen (O). An organic group containing at least hydrogen (such as an alkyl group or aromatic hydrocarbon) is used as a substituent. Further, a fluoro group may be used as a substituent. In addition, an organic group containing at least hydrogen and a fluoro group may be used as a substituent. Polysilazane is formed using a liquid material containing a polymer material having a bond of silicon (Si) and nitrogen (N) as a starting material. When an inorganic material is used, an impurity can be prevented from entering the semiconductor film. As such an inorganic material, silicon oxide, silicon nitride, or silicon oxynitride can be used.

Then, an opening is formed in the first insulating layer 102a, the second insulating layer 102b, and the insulating films 146 and 147, and a source electrode 106a and a drain electrode 106b are formed to connect to the impurity region. A material or a manufacturing method of the source electrode 106a or the drain electrode 106b can be selected similarly as in the above embodiment mode.

As described above, a semiconductor device using a silicon-containing semiconductor film can be completed. The semiconductor device using the silicon-containing semiconductor film can also employ the structure of the insulating film of the invention and can exert its effect.

Embodiment Mode 4

The organic semiconductor device of the invention has a lamination body including the first insulating layer 102a, the second insulating layer 102b, and the layer 103 in which an inorganic compound having a charge-transfer complex is mixed with an organic compound. Therefore, as described in the above embodiment mode, charge separation occurs in the layer 103 in which an inorganic compound having a charge-transfer complex is mixed with an organic compound when gate voltage is applied. Then, the mixed layer 103, the first insulating layer 102a, the second insulating layer 102b, the gate electrode 101, and the semiconductor film 105 to be formed later can constitute a capacitor, and hysteresis due to a charge to be stored in the capacitor occurs. A new organic memory utilizing this characteristic can be provided. Thus, a structure of an organic memory to which the organic semiconductor device is applied is explained in this embodiment mode.

Figure 5:
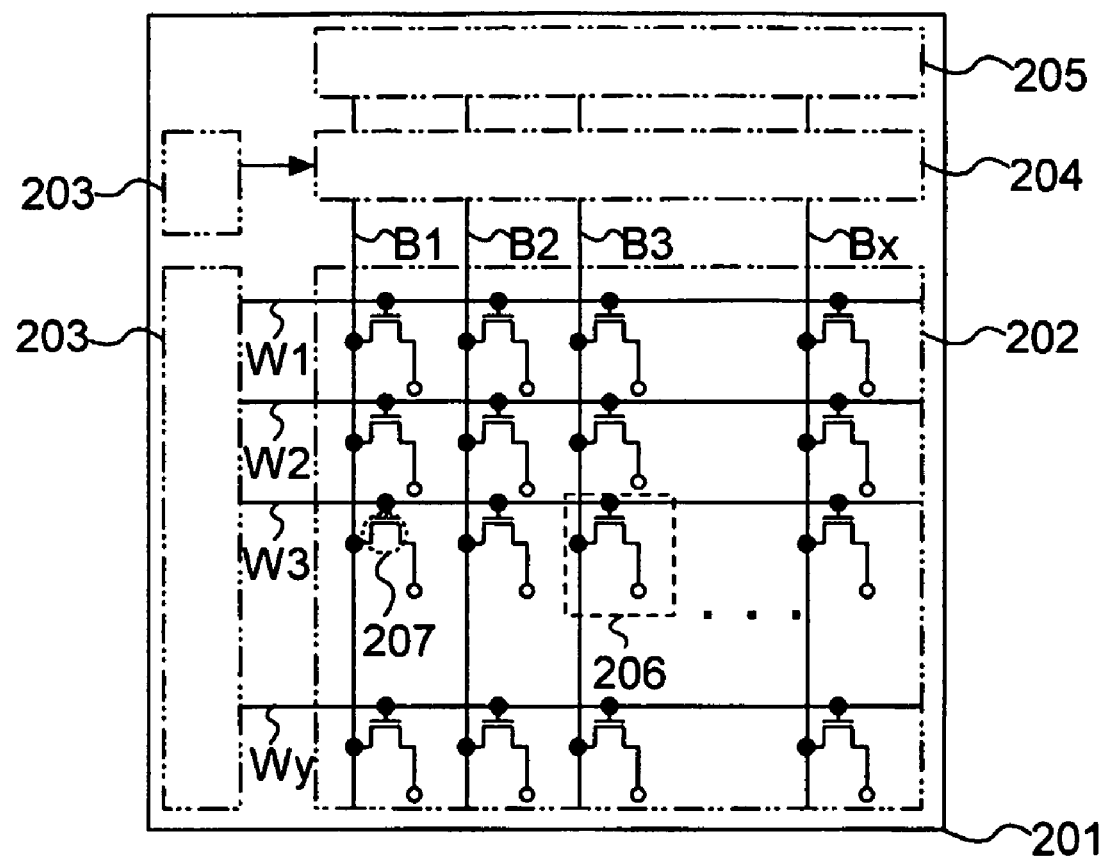
FIG. 5 shows a memory using an organic thin film semiconductor device of the present invention.

As shown in FIG. 5, an organic memory 201 includes a memory cell array 202, a decoder 203, a selector 204, and a read and write circuit 205.

A memory cell 206 of the organic memory 201 has one organic semiconductor device, that is, an organic thin film transistor 207. In the organic thin film transistor 207, either a source electrode or a drain electrode is connected to a bit line Bm ($1 \leq m \leq x$) and a gate electrode is connected to a word line Wn ($1 \leq n \leq y$). The source electrode or the drain electrode which is not connected to the bit line of the organic thin film transistor 207 is connected to have a common potential. Then, common potentials are applied to one ends of all organic thin film transistors at the time of operation (reading or writing) of the organic memory. The memory cells 206 are arranged in matrix to form the memory cell array 202.

In addition, applied voltage can be reduced by employing, as a floating gate, the layer 103 in which an inorganic compound having a charge-transfer complex is mixed with an organic compound and in which charge separation easily occurs, which is one feature of the invention. Consequently, power consumption of the organic memory using the organic semiconductor device of the invention can be reduced.

The organic memory 201 can be employed in a device mounted with a small chip (small integrated circuit) such as an IC card. Due to the organic memory, information can be written and the device can have higher added value.

Although the organic memory using the organic semiconductor device is explained in this embodiment mode, the invention can be similarly applied to a memory using a semiconductor device having an inorganic material described in the above embodiment mode. In other words, this embodiment mode can be freely combined with the above embodiment mode.

Embodiment Mode 5

A semiconductor device of the invention, in other words, a memory including a thin film transistor can be mounted on a television device (also referred to as a television or a television receiver), a digital camera, a digital video camera, a cellular phone device (also referred to as a cellular phone or a cell-phone), a portable information terminal such as a PDA, a portable game machine, a computer monitor, a computer, an audio reproducing device such as car audio, an image reproducing device including a recording medium such as a home-use game machine, or the like. Practical examples of such electronic devices are explained with reference to FIGS. 6A to 6D.

A cellular phone shown in FIG. 6A includes a main body 9101, a display portion 9102, and the like. The main body 9101 or the display portion 9102 can be mounted with the memory including a thin film transistor of the invention. Accordingly, a cellular phone mounted with a memory in which power consumption is reduced can be provided. The memory of the invention can be integrated with a panel included in the display portion. Thus, the cellular phone can have higher added value at low cost.

A portable computer shown in FIG. 6B includes a main body 9401, a display portion 9402, and the like. The main body 9401 or the display portion 9402 can be mounted with the memory including a thin film transistor of the invention. Accordingly, a portable computer mounted with a memory in which power consumption is reduced can be provided. The memory of the invention can be integrated with a panel included in the display portion. Thus, the portable computer can have higher added value at low cost.

A television device shown in FIG. 6C includes a main body 9501, a display portion 9502, and the like. The main body 9501 or the display portion 9502 can be mounted with the memory including a thin film transistor of the invention. Accordingly, a television device mounted with a memory in which power consumption is reduced can be provided. The memory of the invention can be integrated with a panel included in the display portion. Thus, the television device can have higher added value at low cost.

A card shown in FIG. 6D includes a support 9541, a display portion 9542, an integrated circuit chip 9543 such as a memory incorporated in the support 9541, and the like. As the memory incorporated in the support 9541, the memory including a thin film transistor of the invention can be employed. Accordingly, a card mounted with a memory in which power consumption is reduced can be provided. In addition, the card can have higher added value at low cost. Note that a liquid crystal display panel can be used for the display portion 9542 and the card can have even higher added value.

Thus, by applying the memory including a thin film transistor of the invention to an electronic device, power consumption of the electronic device can be reduced and the electronic device can have higher added value. In addition, by mounting an organic memory including an organic thin film transistor, cost reduction can be achieved.

Embodiment 1

This embodiment explains how charge separation occurs when voltage is applied in a structure which is a lamination body of the invention and provided with a layer of the organic compound 103a having a hole transporting material.

Figure 7A:
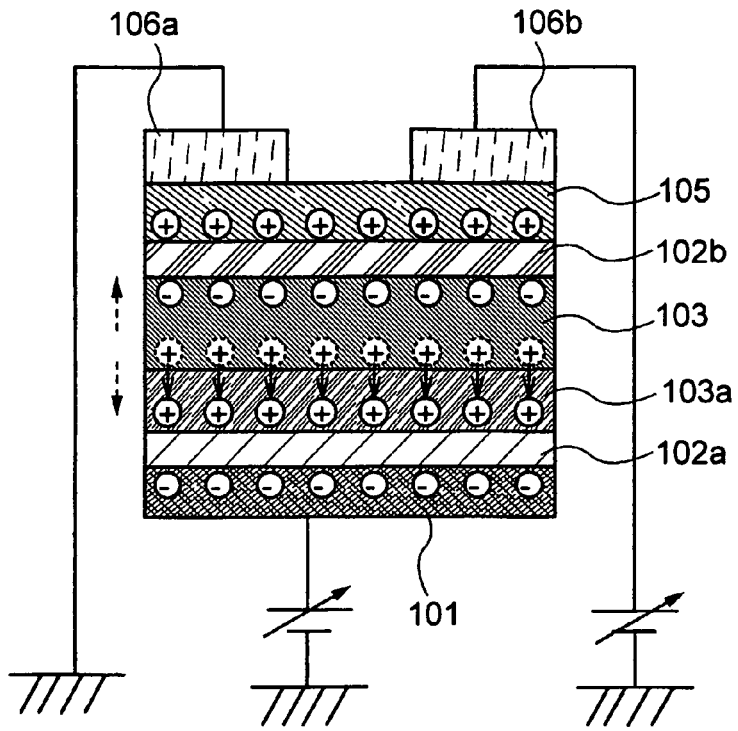
FIGS. 7A to 7D are schematic diagrams showing charge separation in an insulating film of the present invention.

In the case of using a p-type organic material for the semiconductor film 105, negative voltage is first applied to the gate electrode 101 as shown in FIG. 7A. Then, voltage is applied to the layer 103 in which an inorganic compound is mixed with an organic compound. An electron and a hole are separated as indicated by the dotted arrow, and charge separation occurs. At this time, since the layer 103a having a hole transporting material can transport a hole, the hole can move to the layer 103a having a hole transporting material as indicated by the solid arrow.

Figure 7B:
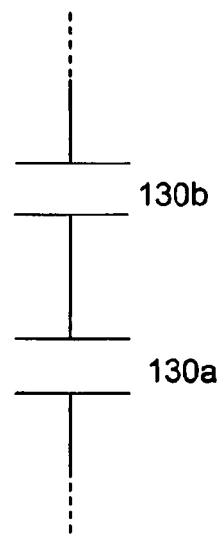

In this state, it can be assumed that the gate electrode 101, the first insulating layer 102a, and the layer 103a having a hole transporting material form a first capacitor element 130a as shown in FIG. 7B. In addition, it can be assumed that the semiconductor film 105, the second insulating layer 102b, and the layer 103 in which an inorganic compound is mixed with an organic compound form a second capacitor element 130b. The first capacitor element 130a is connected in series with the second capacitor element 130b, and capacity as a whole can be increased as compared to the case without the layer in which an inorganic compound is mixed with an organic compound and the layer 103a having a hole transporting material.

Figure 7C:
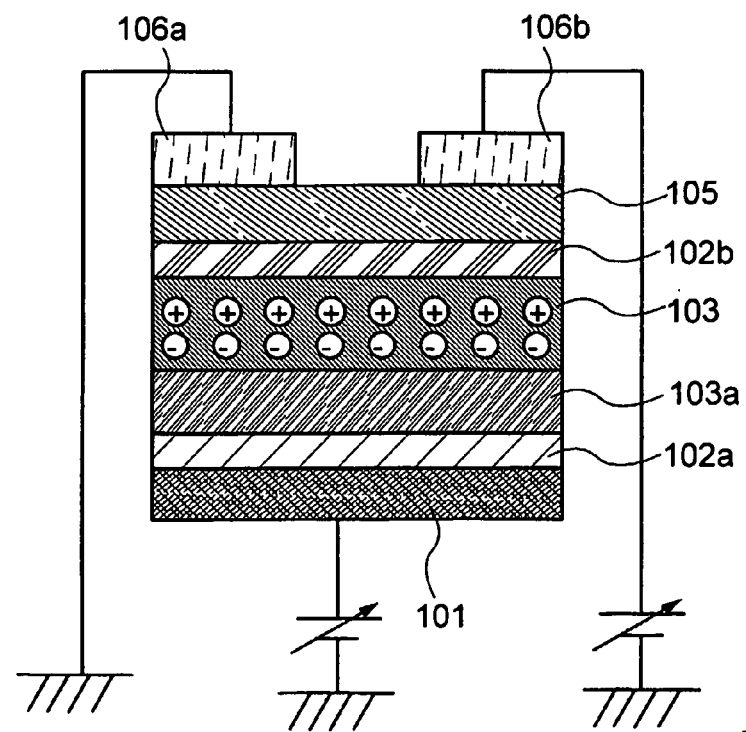

Subsequently, positive voltage is applied to the gate electrode 101 as shown in FIG. 7C. Then, charge separation occurs in the layer 103 in which an inorganic compound is mixed with an organic compound, but a hole does not enter the layer 103a having a hole transporting material.

Figure 7D:
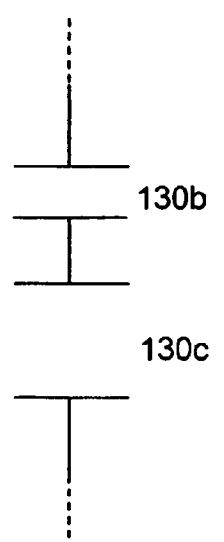

In this state, it can be assumed that the first insulating layer 102a, the layer 103 in which an inorganic compound is mixed with an organic compound, and the layer 103a having a hole transporting material form a third capacitor element 130c as shown in FIG. 7D. The third capacitor element 130c has a longer distance between conductors of the capacitor element than the first capacitor element 130; thus, capacity is decreased. In addition, it can be assumed that the semiconductor film 105, the second insulating layer 102b, and the layer 103 in which an inorganic compound is mixed with an organic compound form the second capacitor element 130b. The second capacitor element 130b is connected in series with the third capacitor element 130c.

When the applied voltage is turned off and there is fear that an electron is bonded with a hole in the layer 103 in which an inorganic compound is mixed with an organic compound, a hole can be held, even if applied voltage is turned off, by sequentially laminating organic compounds having lower and lower ionization potentials as the distance from the layer 103 in which an inorganic compound having a charge-transfer complex is mixed with an organic compound increases. In the same manner, an electron can be held, even if applied voltage is turned off, by sequentially laminating organic compounds having higher and higher electron affinities as the distance from the layer 103 in which an inorganic compound having a charge-transfer complex is mixed with an organic compound increases. As a result, when applied voltage is turned off, a hole and an electron can be prevented from bonding to each other in the layer 103 in which an inorganic compound having a charge-transfer complex is mixed with an organic compound and information can be held.

Figure 9:
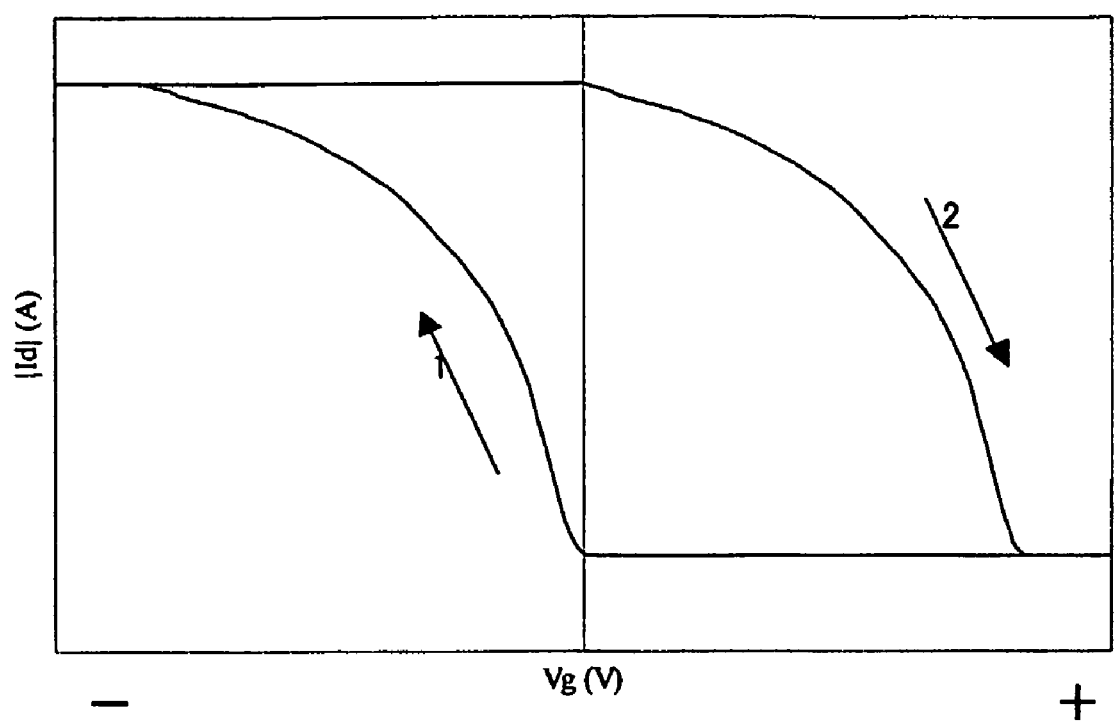
FIG. 9 is a prediction diagram of V-I of a semiconductor device having an insulating film of the present invention.

FIG. 9 shows I-V characteristics in such a state. When negative voltage is applied to the gate electrode 101 as shown in FIG. 7A, I-V characteristics as indicated by Arrow 1 can be exhibited. When positive voltage is applied to the gate electrode 101 as shown in FIG. 7B, I-V characteristics as indicated by Arrow 2 can be exhibited. Thus, when laminated insulating films of the invention are provided, hysteresis occurs. This hysteresis can be utilized for a memory.

A laminated structure is provided so that a predetermined current value is obtained, in other words, a predetermined amount of charges can be held even when applied voltage (Vg) is 0 V, in other words, when it is off.

Note that the case of using an organic semiconductor film is explained in this embodiment. Even in the case of using a silicon-containing semiconductor film as described in Embodiment Mode 3, hysteresis similarly occurs.

EXPLANATION OF REFERENCE

100: Substrate, 101: Gate electrode, 102a: Insulating layer, 102b: Insulating layer, 103: Layer, 103a: Organic compound layer, 103b: Organic compound layer, 105: Semiconductor film, 106a: Source electrode, 106b: Drain electrode, 130a: Capacitor element, 130b: Capacitor element, 130c: Capacitor element, 141: Base film, 145: Semiconductor film, 146: Insulating film, 147: Insulating film, 201: Organic memory, 202: Memory cell array, 203: Decoder, 204: Selector, 205: Circuit, 206: Memory cell, 207: Organic thin film transistor, 9101: Main body, 9102: Display portion, 9401: Main body, 9402: Display portion, 9501: Main body, 9502: Display portion, 9541: Support, 9542: Display portion, and 9543: Integrated circuit chip.

The invention claimed is:

1. A semiconductor device including a memory, the memory comprising:
a gate electrode;
a first insulating layer formed adjacent to the gate electrode;
a floating gate including a mixed layer in which a metal oxide is mixed with an organic compound, formed adjacent to the gate electrode with the first insulating layer interposed therebetween;
a second insulating layer formed adjacent to the floating gate; and
a semiconductor layer formed adjacent to the floating gate with the second insulating layer interposed therebetween,
wherein charge separation occurs in the mixed layer when voltage is applied to the gate electrode.

2. A semiconductor device according to claim 1, wherein the semiconductor device further comprises a source electrode and a drain electrode formed over the semiconductor layer.

3. A semiconductor device according to claim 1, wherein the semiconductor device further comprises a source electrode and a drain electrode formed below the semiconductor layer.

4. A semiconductor device according to claim 1, wherein the semiconductor layer is an organic semiconductor layer.

5. A semiconductor device according to claim 1, wherein the organic compound is selected from the group consisting of 4,4'-bis[N-(1-naphthyl)-N-phenylamino]biphenyl, 4,4'-bis[N-(3-methylphenyl)-N-phenylamino]biphenyl, 4,4',4"-tris(N,N-diphenylamino)triphenylamine, 4,4',4"-tris[N-(3-methylphenyl)-N-phenylamino]triphenylamine, 4,4'-bis{N-[4-(N,N-di-m-tolylamino)phenyl]-N-phenylamino}biphenyl, phthalocyanine, copper phthalocyanine, and vanadyl phthalocyanine.

6. A semiconductor device according to claim 1, wherein the metal oxide is selected from the group consisting of vanadium oxide, molybdenum oxide, niobium oxide, rhenium oxide, tungsten oxide, ruthenium oxide, titanium oxide, chromium oxide, zirconium oxide, hafnium oxide, and tantalum oxide.

7. A semiconductor device according to claim 1, wherein the gate electrode is located below the semiconductor layer.

8. A semiconductor device according to claim 1, wherein the gate electrode is located over the semiconductor layer.

9. A semiconductor device according to claim 1, wherein the semiconductor layer comprises silicon.

10. A semiconductor device including a memory, the memory comprising:
a gate electrode;
a first insulating layer formed adjacent to the gate electrode;
a floating gate including a mixed layer in which a metal oxide is mixed with an organic compound, formed adjacent to the gate electrode with the first insulating layer interposed therebetween,
a second insulating layer formed adjacent to the floating gate; and
a semiconductor layer formed adjacent to the floating gate with the second insulating layer interposed therebetween.

11. A semiconductor device according to claim 10, wherein the organic compound is selected from the group consisting of 4,4'-bis[N-(1-naphthyl)-N-phenylamino]biphenyl, 4,4'-bis[N-(3-methylphenyl)-N-phenylamino]biphenyl, 4,4',4''-tris(N,N-diphenylamino)triphenylamine, 4,4',4''-tris[N-(3-methylphenyl)-N-phenylamino]triphenylamine, 4,4'-bis{N-[4-(N,N-di-m-tolylamino)phenyl]-N-phenylamino}biphenyl, phthalocyanine, copper phthalocyanine, and vanadyl phthalocyanine.

12. A semiconductor device according to claim 10, wherein the metal oxide is selected from the group consisting of vanadium oxide, molybdenum oxide, niobium oxide, rhenium oxide, tungsten oxide, ruthenium oxide, titanium oxide, chromium oxide, zirconium oxide, hafnium oxide, and tantalum oxide.

13. A semiconductor device according to claim 10, wherein the semiconductor device further comprises a source electrode and a drain electrode formed over the semiconductor layer.

14. A semiconductor device according to claim 10, wherein the semiconductor device further comprises a source electrode and a drain electrode formed below the semiconductor layer.

15. A semiconductor device according to claim 10, wherein the semiconductor layer is an organic semiconductor layer.

16. A semiconductor device according to claim 10, wherein the gate electrode is located below the semiconductor layer.

17. A semiconductor device according to claim 10, wherein the gate electrode is located over the semiconductor layer.

18. A semiconductor device according to claim 10, wherein the semiconductor layer comprises silicon.

19. A semiconductor device including a memory, the memory comprising:
a gate electrode;
a first insulating layer formed adjacent to the gate electrode;
a first organic compound layer formed adjacent to the first insulating layer;
a floating gate including a mixed layer in which a metal oxide is mixed with a second organic compound, formed adjacent to the gate electrode with the first insulating layer and the first organic compound layer interposed therebetween;
a second insulating layer formed adjacent to the floating gate; and
a semiconductor layer adjacent to the floating gate with the second insulating layer interposed therebetween.

20. A semiconductor device according to claim 19, wherein the first organic compound layer is selected from the group consisting of 4,4'-bis[N-(1-naphthyl)-N-phenylamino]biphenyl, 4,4'-bis[N-(3-methylphenyl)-N-phenylamino]biphenyl, 4,4',4''-tris(N,N-diphenylamino)triphenylamine, 4,4',4''-tris[N-(3-methylphenyl)-N-phenylamino]triphenylamine, 4,4'-bis{N-[4-(N,N-di-m-tolylamino)phenyl]-N-phenylamino}biphenyl, phthalocyanine, copper phthalocyanine, and vanadyl phthalocyanine.

21. A semiconductor device according to claim 19, wherein the second organic compound is selected from the group consisting of 4,4'-bis[N-(1-naphthyl)-N-phenylamino]biphenyl, 4,4'-bis[N-(3-methylphenyl)-N-phenylamino]biphenyl, 4,4',4''-tris(N,N-diphenylamino)triphenylamine, 4,4',4''-tris[N-(3-methylphenyl)-N-phenylamino]triphenylamine, 4,4'-bis{N-[4-(N,N-di-m-tolylamino)phenyl]-N-phenylamino}biphenyl, phthalocyanine, copper phthalocyanine, and vanadyl phthalocyanine.

22. A semiconductor device according to claim 19, wherein the metal oxide is selected from the group consisting of vanadium oxide, molybdenum oxide, niobium oxide, rhenium oxide, tungsten oxide, ruthenium oxide, titanium oxide, chromium oxide, zirconium oxide, hafnium oxide, and tantalum oxide.

23. A semiconductor device according to claim 19, wherein the semiconductor device further comprises a source electrode and a drain electrode formed over the semiconductor layer.

24. A semiconductor device according to claim 19, wherein the semiconductor device further comprises a source electrode and a drain electrode formed below the semiconductor layer.

25. A semiconductor device according to claim 19, wherein the semiconductor layer is an organic semiconductor layer.

26. A semiconductor device according to claim 19, wherein the gate electrode is located below the semiconductor layer.

27. A semiconductor device according to claim 19, wherein the gate electrode is located over the semiconductor layer.

28. A semiconductor device according to claim 19, wherein the semiconductor layer comprises silicon.

29. A semiconductor device including a memory, the memory comprising:
a gate electrode;
a first insulating layer formed adjacent to the gate electrode;
a first organic compound layer formed adjacent to the first insulating layer;
a floating gate including a mixed layer in which a metal oxide is mixed with a second organic compound, formed adjacent to the gate electrode with the first insulating layer and the first organic compound layer interposed therebetween;
a third organic compound layer formed adjacent to the floating gate;
a second insulating layer formed adjacent to the third organic compound layer; and
a semiconductor layer formed adjacent to the floating gate with the third organic compound layer and the second insulating layer interposed therebetween.

30. A semiconductor device according to claim 29, wherein the first organic compound layer is selected from the group consisting of 4,4'-bis[N-(1-naphthyl)-N-phenylamino]biphenyl, 4,4'-bis[N-(3-methylphenyl)-N-phenylamino]biphenyl, 4,4',4''-tris(N,N-diphenylamino)triphenylamine, 4,4',4''-tris[N-(3-methylphenyl)-N-phenylamino]triphenylamine, 4,4'-bis{N-[4-(N,N-di-m-tolylamino)phenyl]-N-phenylamino}biphenyl, phthalocyanine, copper phthalocyanine, and vanadyl phthalocyanine.

31. A semiconductor device according to claim 29, wherein the second organic compound is selected from the group consisting of 4,4'-bis[N-(1-naphthyl)-N-phenylamino]biphenyl, 4,4'-bis[N-(3-methylphenyl)-N-phenylamino]biphenyl, 4,4',4''-tris(N,N-diphenylamino)triphenylamine, 4,4',4''-tris[N-(3-methylphenyl)-N-phenylamino]triphenylamine, 4,4'-bis{N-[4-(N,N-di-m-tolylamino)phenyl]-N-phenylamino}biphenyl, phthalocyanine, copper phthalocyanine, and vanadyl phthalocyanine.

32. A semiconductor device according to claim 29, wherein the metal oxide is selected from the group consisting of vanadium oxide, molybdenum oxide, niobium oxide, rhenium oxide, tungsten oxide, ruthenium oxide, titanium oxide, chromium oxide, zirconium oxide, hafnium oxide, and tantalum oxide.

33. A semiconductor device according to claim 29, wherein the third organic compound layer is selected from the group consisting of tris(8-quinolinolato)aluminum, tris(4-methyl-8-quinolinolato)aluminum, bis(10-hydroxybenzo[h]-quinolinato)beryllium, bis(2-methyl-8-quinolinolato)-4-phenylphenolato-aluminum, bis[2-(2-hydroxyphenyl)benzoxazolato]zinc, bis[2-(2-hydroxyphenyl)benzothiazolato]zinc, 2-(4-biphenylyl)-5-(4-tert-butylphenyl)-1,3,4-oxadiazole, 1,3-bis[5-(p-tert-butylphenyl)-1,3,4-oxadiazole-2-yl]benzene, 3-(4-tert-butylphenyl)-4-phenyl-5-(4-biphenylyl)-1,2,4-triazole, 3-(4-tert-butylphenyl)-4-(4-ethylphenyl)-5-(4-biphenylyl)-1,2,4-triazole, bathophenanthroline, bathocuproin, and 4,4'-bis(5-methyl-benzoxazol-2-yl)stilbene.

34. A semiconductor device according to claim 29, wherein the semiconductor device further comprises a source electrode and a drain electrode formed over the semiconductor layer.

35. A semiconductor device according to claim 29, wherein the semiconductor device further comprises a source electrode and a drain electrode formed below the semiconductor layer.

36. A semiconductor device according to claim 29, wherein the semiconductor layer is an organic semiconductor layer.

37. An electronic device comprising a semiconductor device according to any one of claims 1, 10, 19 and 29, wherein the electronic device is selected from the group consisting of a television device, a digital camera, a digital video camera, a cellular phone device, a portable information terminal, a portable game machine, a computer monitor, a computer, an audio reproducing device, an image reproducing device including a recording medium.

38. A semiconductor device according to claim 29, wherein the gate electrode is located below the semiconductor layer.

39. A semiconductor device according to claim 29, wherein the gate electrode is located over the semiconductor layer.

40. A semiconductor device according to claim 29, wherein the semiconductor layer comprises silicon.

41. A method for manufacturing a semiconductor device including a memory, the memory comprising the steps of:
    forming a gate electrode;
    forming a first insulating layer adjacent to the gate electrode;
    forming a floating gate including a mixed layer in which a metal oxide is mixed with an organic compound, adjacent to the gate electrode with the first insulating layer interposed therebetween;
    forming a second insulating layer adjacent to the floating gate; and
    forming a semiconductor layer adjacent to the floating gate with the second insulating layer interposed therebetween,
    wherein charge separation occurs in the mixed layer when voltage is applied to the gate electrode.

42. A method for manufacturing a semiconductor device according to claim 41, wherein the method further comprises the steps of forming a source electrode and a drain electrode over the semiconductor layer.

43. A method for manufacturing a semiconductor device according to claim 41, wherein the method further comprises the steps of forming a source electrode and a drain electrode below the semiconductor layer.

44. A method for manufacturing a semiconductor device according to claim 41, wherein the semiconductor layer is an organic semiconductor layer.

45. A method for manufacturing a semiconductor device according to claim 41, wherein the organic compound is selected from the group consisting of 4,4'-bis[N-(1-naphthyl)-N-phenylamino]biphenyl, 4,4'-bis[N-(3-methylphenyl)-N-phenylamino]biphenyl, 4,4',4''-tris(N,N-diphenylamino)triphenylamine, 4,4',4''-tris[N-(3-methylphenyl)-N-phenylamino]triphenylamine, 4,4'-bis{N-[4-(N,N-di-m-tolylamino)phenyl]-N-phenylamino}biphenyl, phthalocyanine, copper phthalocyanine, and vanadyl phthalocyanine.

46. A method for manufacturing a semiconductor device according to claim 41, wherein the metal oxide is selected from the group consisting of vanadium oxide, molybdenum oxide, niobium oxide, rhenium oxide, tungsten oxide, ruthenium oxide, titanium oxide, chromium oxide, zirconium oxide, hafnium oxide, and tantalum oxide.

47. A method for manufacturing a semiconductor device according to claim 41, wherein the gate electrode is located below the semiconductor layer.

48. A method for manufacturing a semiconductor device according to claim 41, wherein the gate electrode is located over the semiconductor layer.

49. A method for manufacturing a semiconductor device according to claim 41, wherein the semiconductor layer comprises silicon.

50. A method for manufacturing a semiconductor device including a memory, the memory comprising the steps of:
    forming a gate electrode;
    forming a first insulating layer adjacent to the gate electrode;
    forming a floating gate including a mixed layer in which a metal oxide is mixed with an organic compound adjacent to the gate electrode with the first insulating layer interposed therebetween;
    forming a second insulating layer adjacent to the floating gate in which the metal oxide is mixed with the organic compound; and
    forming a semiconductor layer adjacent to the floating gate with the second insulating layer interposed therebetween,
    wherein the mixed layer in which the metal oxide is mixed with the organic compound is formed by a co-evaporation method.

51. A method for manufacturing a semiconductor device according to claim 50, wherein the organic compound is selected from the group consisting of 4,4(-bis[N-(1-naphthyl)-N-phenylamino]biphenyl, 4,4(-bis[N-(3-methylphenyl)-N-phenylamino]biphenyl, 4,4(,4(-tris(N,N-diphenylamino)triphenylamine, 4,4(,4-tris[N-(3-methylphenyl)-N-phenylamino]triphenylamine, 4,4(-bis(N-[4-(N,N-di-m-tolylamino)phenyl]-N-phenylamino(biphenyl, phthalocyanine, copper phthalocyanine, and vanadyl phthalocyanine.

52. A method for manufacturing a semiconductor device according to claim 50, wherein the metal oxide is selected from the group consisting of vanadium oxide, molybdenum oxide, niobium oxide, rhenium oxide, tungsten oxide, ruthenium oxide, titanium oxide, chromium oxide, zirconium oxide, hafnium oxide, and tantalum oxide.

53. A method for manufacturing a semiconductor device according to claim 50, wherein the method further comprises the steps of forming a source electrode and a drain electrode over the semiconductor layer.

54. A method for manufacturing a semiconductor device according to claim 50, wherein the method further comprises the steps of forming a source electrode and a drain electrode below the semiconductor layer.

55. A method for manufacturing a semiconductor device according to claim 50, wherein the semiconductor layer is an organic semiconductor layer.

56. A method for manufacturing a semiconductor device according to claim 50, wherein the gate electrode is located below the semiconductor layer.

57. A method for manufacturing a semiconductor device according to claim 50, wherein the gate electrode is located over the semiconductor layer.

58. A method for manufacturing a semiconductor device according to claim 50, wherein the semiconductor layer comprises silicon.

59. A method for manufacturing a semiconductor device including a memory, the memory comprising the steps of:
   forming a gate electrode;
   forming a first insulating layer adjacent to the gate electrode;
   forming a first organic compound layer adjacent to the first insulating layer;
   forming a floating gate including a mixed layer in which a metal oxide is mixed with a second organic compound adjacent to the gate electrode with the first insulating layer and the first organic compound layer interposed therebetween;
   forming a second insulating layer adjacent to the floating gate in which the metal oxide is mixed with the second organic compound; and
   forming a semiconductor layer adjacent to the floating gate with the second insulating layer interposed therebetween,
   wherein the mixed layer in which the metal oxide is mixed with the second organic compound is formed by a co-evaporation method.

60. A method for manufacturing a semiconductor device according to claim 59, wherein the first organic compound layer is selected from the group consisting of 4,4'-bis[N-(1-naphthyl)-N-phenylamino]biphenyl, 4,4'-bis[N-(3-methylphenyl)-N-phenylamino]biphenyl, 4,4',4"-tris(N,N-diphenylamino)triphenylamine, 4,4',4"-tris[N-(3-methylphenyl)-N-phenylamino]triphenylamine, 4,4'-bis{N-[4-(N,N-di-m-tolylamino)phenyl]-N-phenylamino}biphenyl, phthalocyanine, copper phthalocyanine, and vanadyl phthalocyanine.

61. A method for manufacturing a semiconductor device according to claim 59, wherein the second organic compound is selected from the group consisting of 4,4'-bis[N-(1-naphthyl)-N-phenylamino]biphenyl, 4,4'-bis[N-(3-methylphenyl)-N-phenylamino]biphenyl, 4,4',4"-tris(N,N-diphenylamino)triphenylamine, 4,4',4"-tris[N-(3-methylphenyl)-N-phenylamino]triphenylamine, 4,4'-bis{N-[4-(N,N-di-m-tolylamino)phenyl]-N-phenylamino}biphenyl, phthalocyanine, copper phthalocyanine, and vanadyl phthalocyanine.

62. A method for manufacturing a semiconductor device according to claim 59, wherein the metal oxide is selected from the group consisting of vanadium oxide, molybdenum oxide, niobium oxide, rhenium oxide, tungsten oxide, ruthenium oxide, titanium oxide, chromium oxide, zirconium oxide, hafnium oxide, and tantalum oxide.

63. A method for manufacturing a semiconductor device according to claim 59, wherein the method further comprises the steps of forming a source electrode and a drain electrode over the semiconductor layer.

64. A method for manufacturing a semiconductor device according to claim 59, wherein the method further comprises the steps of forming a source electrode and a drain electrode below the semiconductor layer.

65. A method for manufacturing a semiconductor device according to claim 59, wherein the semiconductor layer is an organic semiconductor layer.

66. A method for manufacturing a semiconductor device according to claim 59, wherein the gate electrode is located below the semiconductor layer.

67. A method for manufacturing a semiconductor device according to claim 59, wherein the gate electrode is located over the semiconductor layer.

68. A method for manufacturing a semiconductor device according to claim 59, wherein the semiconductor layer comprises silicon.

* * * * *